US007078624B1

(12) United States Patent
Stewart

(10) Patent No.: US 7,078,624 B1
(45) Date of Patent: Jul. 18, 2006

(54) ELECTRICAL SAFETY POWER CORD

(76) Inventor: Darren Stewart, 5000 Sundance Cir., Anchorage, AK (US) 99507

( * ) Notice: Subject to any disclaimer, the term of this patent is extended or adjusted under 35 U.S.C. 154(b) by 0 days.

(21) Appl. No.: 10/942,406

(22) Filed: Sep. 15, 2004

Related U.S. Application Data

(62) Division of application No. 10/770,313, filed on Feb. 2, 2004, now Pat. No. 6,832,921.

(51) Int. Cl.
*H02G 3/14* (2006.01)
*H05K 5/03* (2006.01)

(52) U.S. Cl. .......................... 174/66; 174/67; 220/241; 220/242; 439/373

(58) Field of Classification Search .................. 174/66, 174/67, 135, 68.1, 65 R, 72 A; 220/241, 220/242, 3.8; 439/134, 135, 136, 137, 142, 439/147, 148, 149, 145, 357, 358, 312, 373, 439/371, 369, 195, 140, 370; D8/349, 350; D13/177
See application file for complete search history.

(56) References Cited

U.S. PATENT DOCUMENTS 2,716,225 A * 8/1955 McCubbin ................... 174/66
2,895,119 A * 7/1959 Montgomery, Jr. .......... 174/66
4,457,571 A * 7/1984 Lavine et al. ............... 439/312
4,917,625 A * 4/1990 Haile ......................... 439/358
4,981,439 A * 1/1991 Piedmont ..................... 174/67
5,049,086 A * 9/1991 Slaven ........................ 174/67
5,069,634 A * 12/1991 Chiarolanzio ............... 439/373
5,348,495 A * 9/1994 Kasden ....................... 439/371
5,454,728 A * 10/1995 Jack ........................... 439/320
5,454,729 A * 10/1995 Wen-Te ...................... 439/357
5,934,919 A * 8/1999 Cross et al. ................ 439/136
5,989,052 A * 11/1999 Fields et al. ................ 439/373
6,428,333 B1 * 8/2002 Rust ........................... 439/140
6,769,930 B1 * 8/2004 McDevitt, Jr. .............. 439/373

* cited by examiner

*Primary Examiner*—Angel R. Estrada
(74) *Attorney, Agent, or Firm*—Michael J. Tavella

(57) ABSTRACT

A power cord that has two safety prongs. A replacement outlet cover is also provided that has corresponding side slots to receive the safety prongs. When the power cord is inserted into the outlet, the safety prongs engage the side slots, which then hold the power cord in place. Once the safety prongs are engaged, the two buttons on the side of the cord head must be compressed to remove the power cord. This type of action is beyond the motor skills of small children, thus making the power cord totally safe for use around children. Moreover, removing the power cords is a simple task for adults, which makes them more likely to be used than more-complicated covers and locks. The power cords can be sold as a kit with a replacement outlet box cover for a low price.

1 Claim, 6 Drawing Sheets

ELECTRICAL SAFETY POWER CORD

CROSS REFERENCE TO RELATED APPLICATIONS

This is a Division of application Ser. No. 10/770,313, filed Feb. 2, 2004, now U.S. Pat. No. 6,832,921.

STATEMENT REGARDING FEDERALLY SPONSORED RESEARCH AND DEVELOPMENT

Not Applicable

BACKGROUND OF THE INVENTION

1. Field of the Invention

This invention relates electrical safety outlets and particularly to electrical safety outlets having lockable covers.

2. Description of the Prior Art

Electrical outlets are common fixtures in homes today. Despite a number of safety improvements, these outlets remain a danger to small children. FIG. 1 shows a standard modern electrical outlet 100 as prior art. The slot openings 101 in the outlet that connect to the interior wiring are inviting to children who are driven to investigate everything. Every year children are electrocuted when they insert objects into the slots of electrical outlets.

To protect them from such danger, large covers have been invented. These covers fit over the entire outlet and can be locked. While making the outlet safe, they also make the outlet difficult to use. The cover must be unlocked every time the outlet is needed. Moreover, these covers extend out into the room, making furniture placement sometimes difficult.

Another device commonly used today is a small plastic cover 102, shown in FIG. The cover 102 has prongs 103 that engage the slot openings in the outlet. When in place, these covers completely prevent access to the outlet slots; yet, they are easily removable when access to the outlet is needed. Moreover, because they are relatively flat, they do not block furniture placement. Despite these advantages, they have one major drawback. A determined child can pull them out of the outlet because there is nothing holding them in place. As a result, they improve safety only marginally.

BRIEF DESCRIPTION OF THE INVENTION

The instant invention overcomes these problems. It is a removable cover that has two safety prongs. A replacement outlet cover is also provided that has corresponding side slots to receive the safety prongs. When the cover is inserted into the outlet, the safety prongs engage the side slots, which then hold the cover in place. Once the safety prongs are engaged, the safety prongs must be compressed to remove the cover. This type of action is beyond the motor skills of small children, thus making the covers totally safe for use around children. Moreover, removing the covers is a simple task for adults, which makes them more likely to be used than more complicated covers and locks. Finally, the covers can be sold as a kit with a replacement outlet box cover for a low price. This makes them affordable as well as easy to install and use.

DETAILED DESCRIPTION OF THE INVENTION

Figure 3:
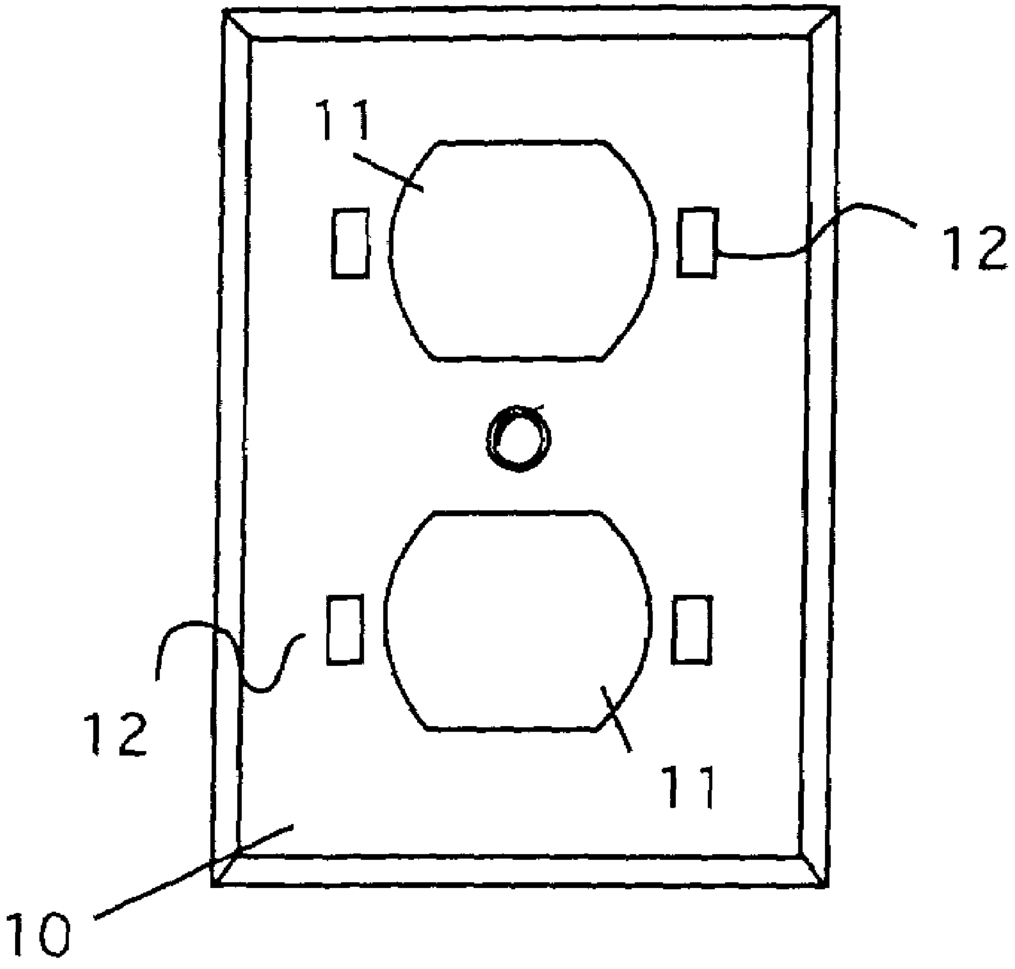
FIG. 3 is a front view of a replacement outlet cover, modified to accept the new safety cover.
Figure 4:
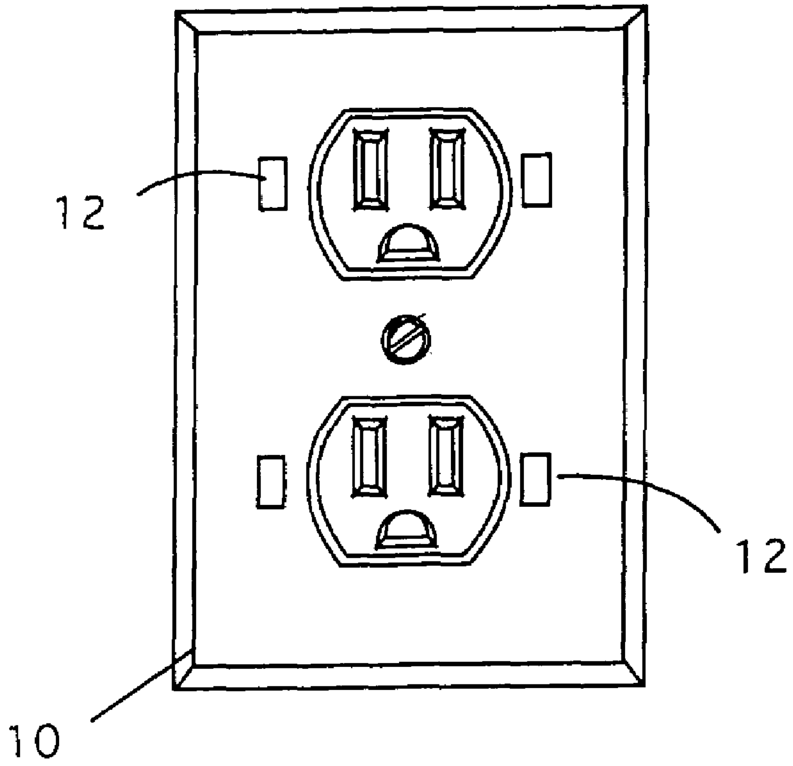
FIG. 4 is a front view of a replacement outlet cover, modified to accept the new safety cover installed on a receptacle.

FIG. 3 is a front view of a replacement outlet cover 10, modified to accept the new safety cover 20. The replacement cover is similar to the standard outlet cover in that it has two openings 11 for the receptacle. Unlike the standard outlet cover, the replacement cover 10 has one addition: on the space adjacent to the openings 11 for the receptacle are two slots 12. These slots are located on both the top and bottom of the replacement cover as shown. FIG. 4 shows the cover 10 installed on a receptacle. As shown, the cover 10 is the same size and shape as a standard outlet cover so that there is no problem in making the replacement.

Figure 1:
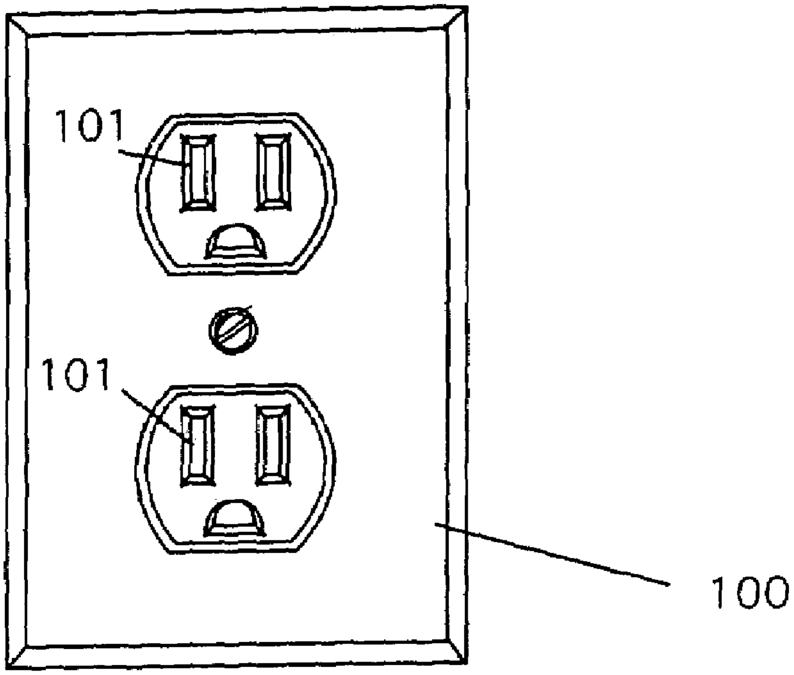
Figure 1 Prior Art
FIG. 1 is a front view of an outlet cover installed on a receptacle as prior art.
Figure 2:
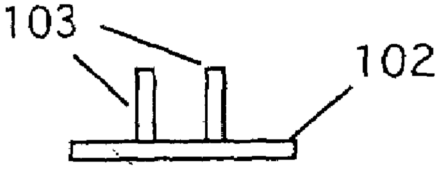
Figure 2 Prior Art
FIG. 2 is a top view of a safety cover as prior art.
Figure 5:
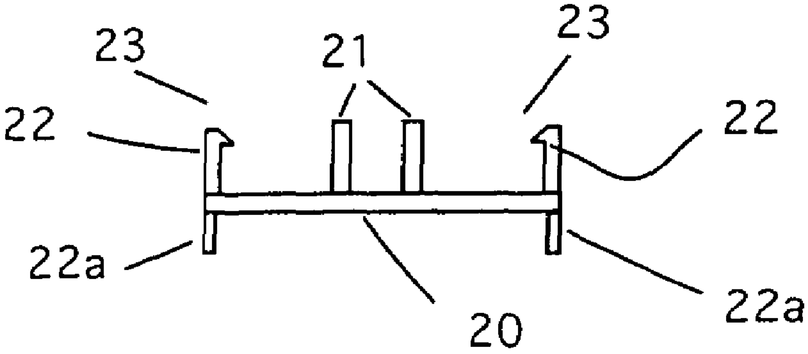
FIG. 5 is a top view of the safety cover.

FIG. 5 is a top view of the safety cover 20. The safety cover has two prongs 21 like the current safety cover shown in FIG. 2. In addition, the safety cover 20 has two additional prongs 22 that align with the slots 12. Note that the prongs 22 have hooked ends 23. These hooked ends pass through the slots 12 and engage the back of the replacement cover (see e.g. FIG. 5). In this way, the outer prongs 22 prevent a child from simply pulling the safety cover out of the receptacle. A user must first push the prongs 22 slightly apart, by pushing in on the ribs **22*a*, so the hooked ends 23 pass through the slots 12** before the safety cover can be removed.

Note that the ribs **22*a*** do not protrude excessively. This makes the safety cover completely safe for use around small children, yet the benefits of the flat safety cover are retained.

Figure 6:
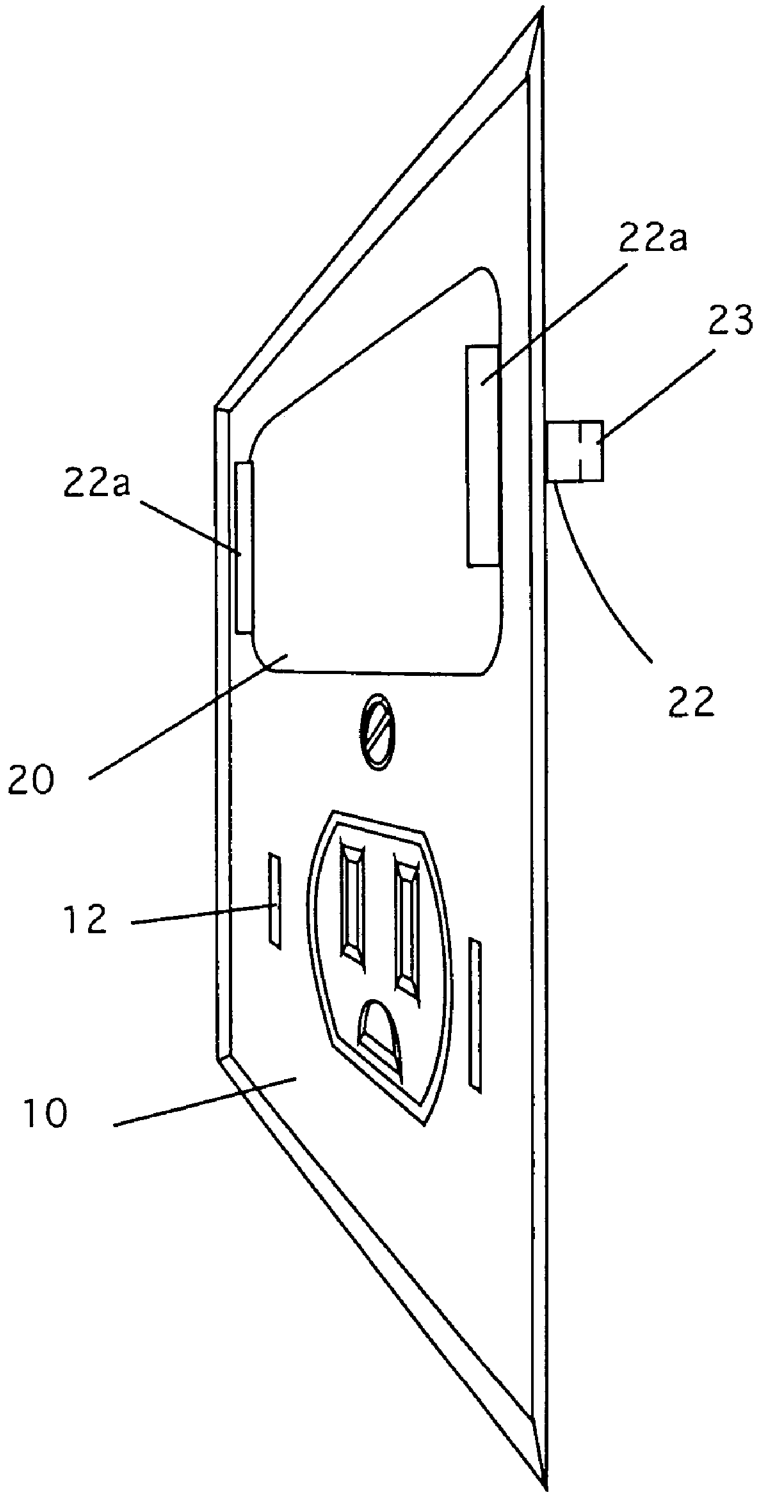
FIG. 6 is a perspective view of the replacement outlet cover with a safety cover installed, showing a side clip engaging a side slot.

FIG. 6 is a perspective view of the replacement outlet cover with a safety cover installed, showing a side clip engaging a side slot. As shown in this figure, the hooked end 23 of the prong 22 is shown on the back side of the replacement cover. In this figure, the ribs **22*a*** are clearly shown.

Figure 7:
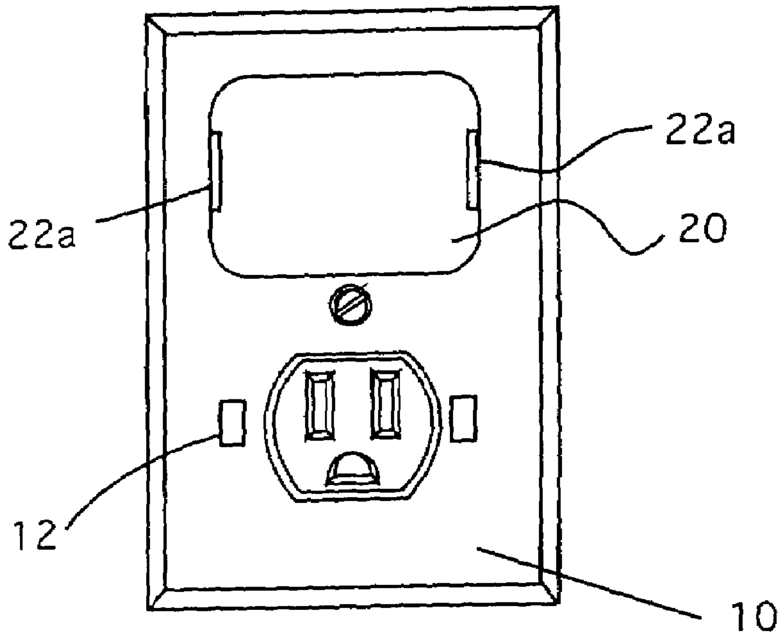
FIG. 7 is a front view of the safety cover installed in the replacement outlet cover.

FIG. 7 is a front view of the safety cover 20 installed in the replacement outlet cover 10. Here, the entire receptacle is covered. In the view, only one cover is shown. In actual use, two covers would be used.

Figure 8:
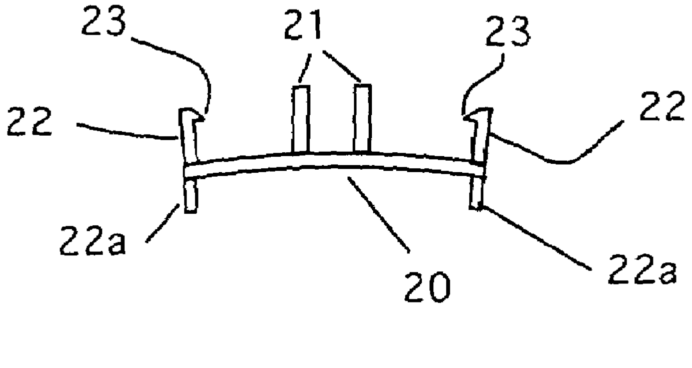
FIG. 8 is a detail top view of the safety cover showing the cover in the position for extraction.

FIG. 8 is a detail top view of the safety cover showing the cover in the position for extraction. Here, the safety cover 20 is shown bent back (the figure is slightly exaggerated for clarity). As the cover is bent back, the prongs 22 bend as well. In this way, the prong ends 23 align with the slots 12 in the cover 10 so that the safety cover 20 can be easily removed.

Figure 9:
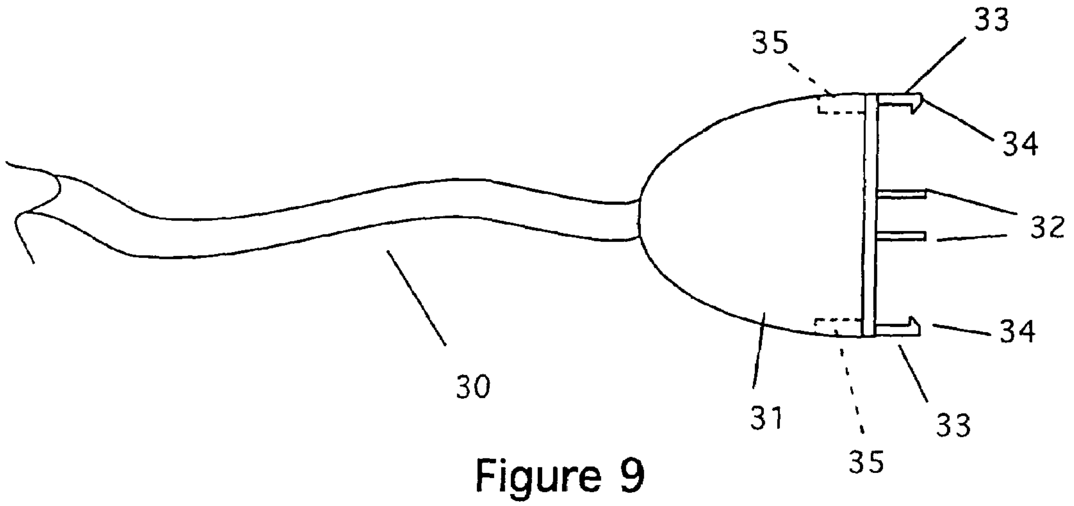
FIG. 9 is a top detail of a power cord that contains the safety removal system.

Once the replacement covers 10 are in use, power cords can be made with extra prongs as well. FIG. 9 is a top detail of a power cord that contains the safety removal system. Here, a power cord 30 has a plug head 31 that has a set of power prongs 32 and a pair of security prongs 33. As in the case of the safety covers, the security prongs have angled ends 34 that pass through the slots 12 and hold the plug 30 in place. The figure shows a plug having two prongs, however, the system can be used with three prong plugs as well.

Figure 10:
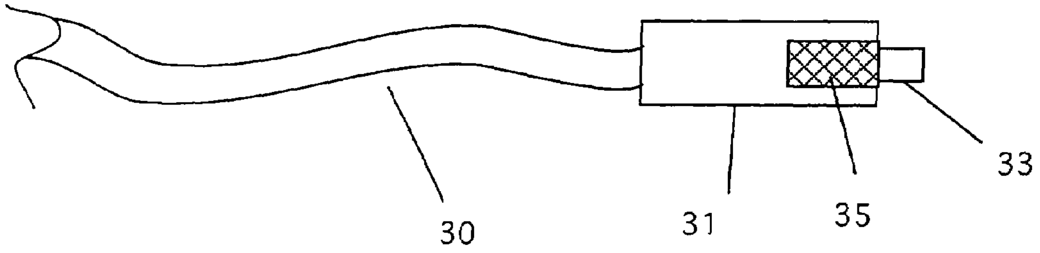
FIG. 10 is a side view of the power cord of FIG. 8 showing the release button.

FIG. 10 is a side view of the power cord 30 of FIG. 9 showing a release button 35. There are two buttons 35, one on each side of the plug 31. When the buttons are squeezed, they cause the prongs 33 to flex outward (see e.g., FIG. 8), which allows the hooked ends 34 to align with the slots 12.

In the preferred embodiment, the safety covers are made of molded plastic. However, and suitably strong and non-conductive material may be used as well.

The present disclosure should not be construed in any limited sense other than that limited by the scope of the claims having regard to the teachings herein and the prior art being apparent with the preferred form of the invention disclosed herein and which reveals details of structure of a preferred form necessary for a better understanding of the invention and may be subject to change by skilled persons within the scope of the invention without departing from the concept thereof.

I claim:

1. An electrical cord plug for use with a safety outlet cover having a generally flat rectangular surface, a back, a first outlet hole, and a second outlet hole formed therein, a first pair of rectangular slots, positioned adjacent to said first outlet hole, a second pair of rectangular slots positioned adjacent to said second outlet hole, wherein said first and second pairs of rectangular slots are in the plane of the generally flat rectangular surface of said safety outlet cover, the electrical cord plug comprising:

a) a plug head having at least a pair of electrical power prongs extending outwardly therefrom;

b) a pair of safety prongs fixedly attached to said plug head, each of said pair of safety prongs having a hooked end, whereby when said plug head is aligned with said safety outlet cover, said pair of safety prongs aligns with one of said pairs of rectangular slots in said safety outlet cover, and further wherein when said plug head is engaged with one of said outlet holes, the hooked ends on said pair of safety prongs pass through one of said pair of rectangular slots such that the hooked ends engage the back of the safety outlet cover; and c) means to release said pair of safety prongs from said safety outlet cover, including a pair of buttons attached to said plug head and being in operable communication with said pair of safety prongs.

* * * * *